United States Patent [19]

Maier, Jr.

[11] Patent Number: 4,457,068

[45] Date of Patent: Jul. 3, 1984

[54] METHOD OF WRAPPING A CYLINDRICAL SHAPE

[76] Inventor: Leo A. Maier, Jr., 272 Langhorne Ave., Bethlehem, Pa. 18017

[21] Appl. No.: 331,528

[22] Filed: Dec. 17, 1981

[51] Int. Cl.³ .................... H01B 13/00; H05K 3/00; B21D 53/00; B23P 15/26

[52] U.S. Cl. .................... 29/825; 29/157 R; 29/402.03; 29/450; 138/150; 138/168; 174/71 R; 52/DIG. 13

[58] Field of Search .................... 29/450, 157 R, 825, 29/402.03; 174/71 R, 72 A, 72 R, 72 C; 138/147, 150, 149, 151, 129, 168; 24/201 C, 204; 52/DIG. 13

[56] References Cited

U.S. PATENT DOCUMENTS

| | | | |
|---|---|---|---|
| 2,006,826 | 7/1935 | Elliott | 174/71 R X |
| 2,476,666 | 7/1949 | Keller | 138/150 X |
| 2,939,905 | 6/1960 | Canfield | 174/71 R |
| 2,941,027 | 6/1960 | Svec | 138/168 X |
| 2,960,561 | 11/1960 | Plummer | 138/168 X |
| 3,139,116 | 6/1964 | Plummer | 24/201 C X |
| 3,180,923 | 4/1965 | Gow et al. | 174/72 A |
| 3,338,028 | 8/1967 | Freeman | 24/204 UX |
| 3,941,159 | 3/1976 | Toll | 138/147 |
| 4,095,937 | 6/1978 | Colburn et al. | 138/150 X |
| 4,142,565 | 3/1979 | Plunkett, Sr. | 24/204 X |

*Primary Examiner*—Charlie T. Moon

*Attorney, Agent, or Firm*—Michael J. Delaney

[57] ABSTRACT

A method of wrapping a cylindrical shape uses an elongated sheet material with a first fastener portion extending along one edge and one face of the material and a second fastener portion extending along the opposite edge and opposite face of the material. The material is helically wrapped about the cylindrical shape with the edges overlapped and the first fastener portion continuously contacting and releasably attached to the second adhesive portion to secure the sheet material to the cylindrical shape.

4 Claims, 4 Drawing Figures

FIG. 1
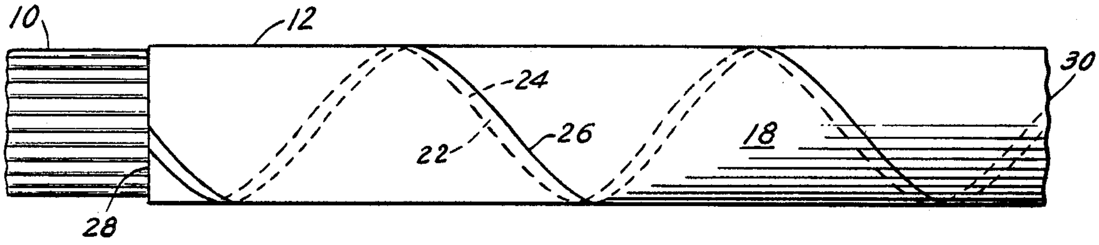
FIG. 2
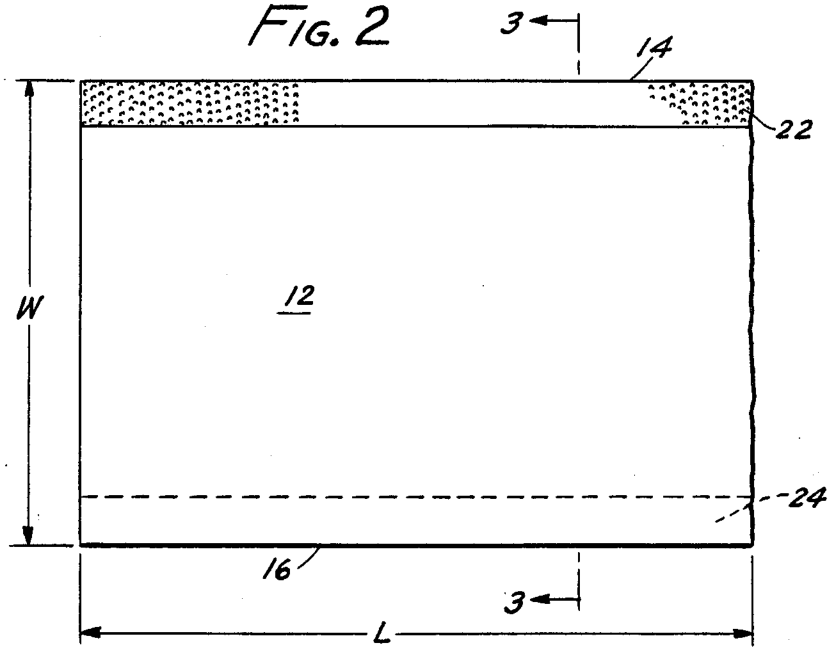
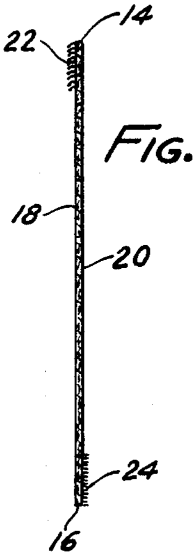
FIG. 3
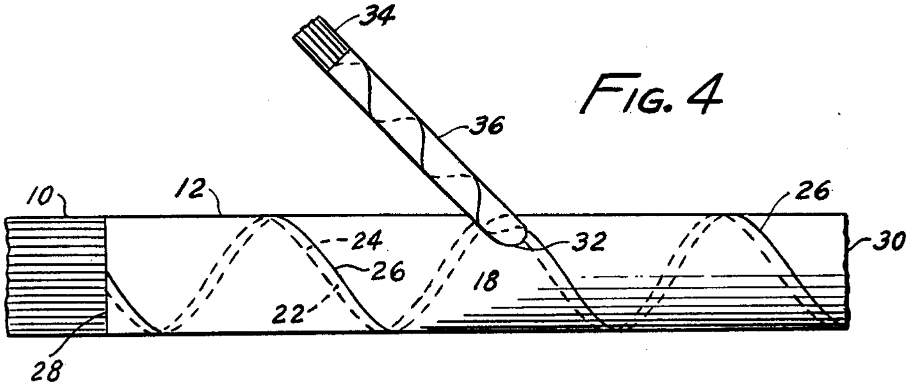
FIG. 4

METHOD OF WRAPPING A CYLINDRICAL SHAPE

BACKGROUND OF THE INVENTION

There are many prior art methods of wrapping various shapes.

U.S. Pat. No. 3,941,159 to Toll discloses wrapping insulation material about a pipe by means of a sheet material which includes Velcro hook and pile portions to create a longitudinal seam along the pipe.

U.S. Pat. No. 3,139,116 to Plummer discloses an adjustable boot which is helically wrapped about members of varying diameter and held in place by interlocking tongues and grooves.

U.S. Pat. No. 3,338,028 to Freeman discloses a bandage for the leg of a race horse wherein the final spiral wrap includes a Velcro fastener to secure the bandage in place.

The prior art methods were not very entirely satisfactory and included certain deficiencies. The wrapping material size varied with the size of the cylindrical shape being wrapped. It was not practical for a cylindrical shape having a substantial length to be wrapped because of the fastening arrangement. The wrapping was too costly and time consuming. The seam of the wrapping was not tight. The wrapping was too loose or became loose or opened in use. The wrapping was not reusable. The wrapping could not be opened at a particular location to repair the wrapped members.

SUMMARY OF THE INVENTION

It is an object of this invention to provide a method of wrapping a cylindrical shape which overcomes the above deficiencies of the prior art.

The method of this invention utilizes an elongated sheet material which is helically wrapped about an essentially cylindrical shape. The sheet material is held in place by a continuous fastener which includes a first portion secured to a second portion. The first fastener portion extends along one edge and one face of the sheet material and the second fastener portion extends along the opposite edge and opposite face of the sheet material. The edges are overlapped and the fastener portions contact one another to secure the sheet material about the cylindrical shape. The first fastener portion could be a Velcro hook portion and the second fastener portion a Velcro pile portion, or the first and second fastener portions could be adhesive portions which adhere to one another but can be separated in the same manner the Velcro portions can be separated.

BRIEF DESCRIPTION OF THE DRAWINGS

FIG. 1 is a view showing a cylindrical shape wrapped with sheet material in accordance with the method of this invention.

FIG. 2 is a plan view of the sheet material used in the method of this invention.

FIG. 3 is a view taken along the lines 3—3 of FIG. 2.

FIG. 4 is a view of another embodiment of this invention.

DETAILED DESCRIPTION OF THE DRAWINGS

As shown in FIG. 1, 10 designates a cylindrical shape which is made up of a bundle of electrical cables. Obviously the cylindrical shape 10 could be a single item such as a pipe or a cylindrical tank or vessel or the like as opposed to a bundle of items. Furthermore, items of the bundle could be tubing or wire or hose or the like as opposed to electrical cables or a mixture of such items. The meaning of the term cylindrical shape is intended to cover all such alternatives including a cylindrical shape having varying diameters.

Spirally or helically wrapped about the cylindrical shape 10 is sheet material 12. Sheet material 12 may be any suitable flexible material of a type impervious to fluid or a composite material or the like.

Referring to FIGS. 2 and 3 the sheet material 12 has a pair of longitudinal edges 14 and 16 and an outside face 18 and an inside face 20. The length L of the sheet material 12 is dependent on the length of cylindrical shape 10 to be wrapped. A constant width W of the sheet material 12 can be used to wrap a variety of cylindrical shapes 10 having different diameters. Thus the width W of sheet material 12 need not vary with the size of cylindrical shape 10 being wrapped. Attached to outside face 18 of the sheet material 12, extending along and coextensive with longitudinal edge 14 as a Velcro hook portion 22. Velcro pile portion 24 is attached to inside face 20 of sheet material 12 and extends along and is coextensive with longitudinal edge 16.

By Velcro hook portion 22 and Velcro pile portion 24 is meant the well known fastening means or the like, one such fastening means is sold under the trademark Velcro or similar material. Furthermore the fastening means could be a first adhesive portion and a second adhesive portion which extend along the edges and when in contact with each other form a releasable fastening means wherein incremental portions of the fastening portion can be released without disturbing the entire fastened joint.

In employing the method of this invention, the sheet material 12 having a pair of longitudinal edges 14 and 16 and inside and outside faces, 20 and 18, respectively, is helically wrapped about a cylindrical shape 10 with inside face 20 in contact with the cylindrical shape 10 and Velcro hook portion 22 in contact with Velcro pile portion 24 whereby a continuous spiral joint 16 is formed to secure the sheet material 12 to the cylindrical shape 10.

It should be understood that for a given width W and length L of sheet material 12 a variety of cylindrical shapes 10 having different diameters may be wrapped. Furthermore, as the diameter of the cylindrical shape 10 decreases the pitch of the helix of the spiral joint 26 increases.

After the sheet material 12 is helically wrapped about the cylindrical shape 10 with a rectangular sheet material 12, as shown in FIG. 2, it may be desirable to cut off a portion of the sheet material 12 to provide the square ends 28,30 shown in FIG. 1. On the other hand and depending upon the application of the method of this invention it may not be necessary to cut off such a portion to provide square ends.

Referring to FIG. 4, sheet material 12 is shown helically wrapped about a cylindrical shape 10 such that a spiral joint 26 is formed, all as described about for FIG. 1. However, the versatility of this invention is shown whereby an opening 32 is formed in the sheet material 12 by separating a portion of the spiral joint 26 and a branch line 34 is formed by passing some of the items which form the cylindrical shape through the opening 32. In turn the branch line 34 can be helically wrapped with sheet material 36. Alternatively a branch line 34 could pass through a hole cut in the sheet material 12 rather than the opening in the spiral joint.

While I have described my invention in some detail I do not wish to be limited to the exact and specific details disclosed but may wish to use such equivalents, alternatives and substitutes as are within the spirit and scope of my invention as pointed out in the appended claims.

I claim:

1. A method of enclosing a plurality of individual members such as electrical cables, tubes, hoses or the like comprising:

(a) providing an elongated sheet material having a width which is not dependent on the size of the members and a pair of substantially parallel longitudinal edges and inside and outside faces, with a first hook fastener portion extending along, coextensive with and attached to one of said pair of edges and one of said faces and a second pile fastener portion extending along, coextensive with and attached to the other of said pair of edges and the other of said faces, and (b) helically wrapping said sheet material about said members with the first fastener portion continuously contacting and overlapping the second fastener portion and forcing the hook fastener portion on the one edge on one of said faces into interlocking engagement with the pile fastener portion of the other edge on the other face of the sheet material to releaseably secure the first and second fastener portions to each other and to secure said sheet material about said members and to form a continuous spiral joint secured together by said first and second fastener portions and an incremental portion of said first and second fstener portions may be opened and closed at any particular location to allow said members to be repaired, and (c) opening an incremental portion of the spiral joint intermediate the ends thereof and repairing the members and closing the opened portion of the spiral joint.

2. A method of enclosing an essentially cylindrical shape including a plurality of individual members comprising:

(a) providing an elongated sheet material having a width which is not dependent on the size of the cylindrical shape and a pair of substantially parallel longitudinal edges and inside and outside faces, with a first hook fastener portion extending along, coextensive with and attached to one of said pair of edges and one of said faces and a second pile fastener portion extending along, coextensive with and attached to the other of said pair of edges and the other of said faces, (b) helically wrapping said sheet material about said plurality of individual members with the first fastener portion continuously contacting and overlapping the second fastener portion and forcing the hook fastener portion on the one edge on one of said faces into interlocking engagement with the pile fastener portion of the other edge on the other face of the sheet material to releaseably secure the first and second fastener portions to each other and to secure said sheet material about the individual members and to form a continuous spiral joint secured together by said first and said second fastener portions and an incremental portion of said first and second fastener portions may be opened and closed at any particular location to allow said members to be repaired and opened in its entirety to allow the sheet material to be reused, and (c) forming an opening in said spiral joint intermediate the ends thereof by separating said first fastener portion from said second fastener portion and passing an individual member through said opening to form a branch line extending from the cylindrical shape.

3. The method of claim 2 further comprising helically wrapping the branch line with sheet material.

4. A method of enclosing a plurality of individual members, such as, electrical cables, tubes, hoses or the like, comprising:

(a) providing an elongated sheet material having a width which is not dependent on the size of the individual members and a pair of substantially parallel longitudinal edges and inside and outside faces, with a first hook fastener portion extending along, coextensive with and attached to one of said pair of edges and one of said faces and a second pile fastener portion extending along, coextensive with and attached to the other of said pair of edges and the other of said faces, (b) helically wrapping said sheet material about said members with said first hook fastener portion continuously contacting and overlapping said second pile fastener portion and forcing the hook fastener portion on the one edge on one of said faces into interlocking engagement with the pile fastener portion of the other edge on the other face of the sheet material to releaseably secure said first and second fastener portions to each other and to secure said sheet material about said members and to form a continuous spiral joint secured together by said first and second fastener portions, and (c) forming an opening in an incremental portion of said spiral joint intermediate the ends thereof by separating said first and second fastener portions to allow one of said members to be repaired, repairing the member and thereafter closing said opening by securing together said first and second fastener portions.

* * * * *